(12) United States Patent
Park et al.

(10) Patent No.: US 12,025,672 B2
(45) Date of Patent: Jul. 2, 2024

(54) BATTERY MANAGEMENT APPARATUS AND METHOD

(71) Applicant: LG ENERGY SOLUTION, LTD., Seoul (KR)

(72) Inventors: Jae-Dong Park, Daejeon (KR); Jung-Hyun Kwon, Daejeon (KR); Hyun-Ki Cho, Daejeon (KR); Jung-Hoon Lee, Daejeon (KR); Hu-Jun Lee, Daejeon (KR); Ji-Won Hwang, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/015,265

(22) PCT Filed: Jun. 3, 2021

(86) PCT No.: PCT/KR2021/006976
§ 371 (c)(1),
(2) Date: Jan. 9, 2023

(87) PCT Pub. No.: WO2022/010109
PCT Pub. Date: Jan. 13, 2022

(65) Prior Publication Data
US 2023/0258729 A1     Aug. 17, 2023

(30) Foreign Application Priority Data

Jul. 10, 2020  (KR) ......................... 10-2020-0085464

(51) Int. Cl.
*G01R 31/385*    (2019.01)
*G01R 31/36*     (2020.01)
(Continued)

(52) U.S. Cl.
CPC ....... *G01R 31/385* (2019.01); *G01R 31/3648* (2013.01); *G01R 31/371* (2019.01);
(Continued)

(58) Field of Classification Search
None
See application file for complete search history.

(56) References Cited

U.S. PATENT DOCUMENTS

2010/0008275 A1   1/2010  Lee et al.
2011/0204898 A1   8/2011  Kim et al.
(Continued)

FOREIGN PATENT DOCUMENTS

JP     5065000 B2    10/2012
JP     5403191 B2     1/2014
(Continued)

OTHER PUBLICATIONS

Angel Kirchev ("Chapter 20 Battery Management and Battery Diagnostics", Editors: Patrick T. Moseley, Jürgen Garche, Electrochemical Energy Storage for Renewable Sources and Grid Balancing, Elsevier, 2015, pp. 411-435) (Year: 2015).*

(Continued)

*Primary Examiner* — Roy Y Yi
(74) *Attorney, Agent, or Firm* — Birch, Stewart, Kolasch & Birch, LLP

(57) ABSTRACT

A battery management apparatus is discussed, and includes: a measuring unit connected to a battery and configured to operate in a measurement mode during a predetermined measurement time at each preset measurement cycle and measure battery information including at least one of voltage and temperature of the battery while operating in the measurement mode; and a control unit configured to operate in a communication mode during a preset operation time at each preset communication cycle, receive the battery infor- (Continued)

mation from the measuring unit while operating in the communication mode, set a next operation time point at which the measuring unit is to operate in the measurement mode based on at least one of the communication cycle and a measurement time, and change an operation time to operate in the communication mode at each subsequent communication cycle based on the measurement time.

20 Claims, 9 Drawing Sheets

(51) Int. Cl.
G01R 31/371 (2019.01)
G01R 31/392 (2019.01)
H01M 10/42 (2006.01)

(52) U.S. Cl.
CPC ........ G01R 31/392 (2019.01); H01M 10/425 (2013.01); *H01M 2010/4278* (2013.01)

(56) References Cited

U.S. PATENT DOCUMENTS

| | | |
|---|---|---|
| 2014/0285156 A1 | 9/2014 | Mukaitani et al. |
| 2014/0306667 A1 | 10/2014 | Mukaitani et al. |
| 2014/0312915 A1 | 10/2014 | Mukaitani et al. |
| 2015/0139198 A1 | 5/2015 | Hwang et al. |
| 2015/0349547 A1 | 12/2015 | Jeon |
| 2016/0050712 A1* | 2/2016 | Kim .................. H04W 52/0287 370/311 |
| 2017/0234932 A1 | 8/2017 | Jeon |
| 2020/0025829 A1 | 1/2020 | Jeon |
| 2021/0055348 A1 | 2/2021 | Kim et al. |

FOREIGN PATENT DOCUMENTS

| | | |
|---|---|---|
| JP | 5840497 B2 | 1/2016 |
| JP | 2017-60373 A | 3/2017 |
| JP | 6210542 B2 | 10/2017 |
| JP | 2020-519858 A | 7/2020 |
| KR | 10-0516019 B1 | 9/2005 |
| KR | 10-0745725 B1 | 8/2007 |
| KR | 10-1468314 B1 | 12/2014 |
| KR | 10-2015-0137678 A | 12/2015 |
| KR | 10-1920467 B1 | 11/2018 |
| KR | 10-2019-0040412 A | 4/2019 |
| KR | 10-2035674 B1 | 10/2019 |
| KR | 10-2091772 B1 | 3/2020 |
| WO | WO 2019/188888 A1 | 10/2019 |

OTHER PUBLICATIONS

International Search Report (PCT/ISA/210) issued in PCT/KR2021/006976 dated Sep. 23, 2021.

* cited by examiner

BATTERY MANAGEMENT APPARATUS AND METHOD

TECHNICAL FIELD

The present application claims priority to Korean Patent Application No. 10-2020-0085464 filed on Jul. 10, 2020 in the Republic of Korea, the disclosures of which are incorporated herein by reference.

The present disclosure relates to a battery management apparatus and method, and more particularly, to a battery management apparatus and method capable of effectively reducing power consumption required for battery information measurement and battery state diagnosis.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

After these batteries are produced and assembled, they may go through a distribution process to be delivered to customers. In the distribution process, the batteries may be naturally discharged, and in particular, in the case where a defective battery is generated during the manufacturing process, the batteries may be discharged more than a normal battery. Therefore, in the battery distribution process, it is one of the most important processes to diagnose a battery defect by measuring voltage and temperature of the battery.

However, in the battery distribution process, there is a limit for a worker to measure the voltage and temperature of each battery.

In addition, since commercial power is not supplied in most cases during the battery distribution process, the voltage and temperature of the battery are measured through a battery management system (BMS) or the like. Also, even though the state of the battery is diagnosed, the amount of power provided to the battery management system is inevitably limited.

Therefore, in order to continuously diagnose the state of the battery in the battery distribution process, it is required to develop a technology that may dramatically reduce power consumption by reducing unnecessary power consumption.

DISCLOSURE

Technical Problem

The present disclosure is designed to solve the problems of the related art, and therefore the present disclosure is directed to providing a battery management apparatus and method, which may reduce unnecessary power consumption in a situation where the provided power is limited such as in the battery distribution process by synchronizing the time point at which the measuring unit operates in a measurement mode and the time point at which the control unit operates in a communication mode and reducing the operation time when the control unit operates in the communication mode.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery management apparatus according to one aspect of the present disclosure may comprise: a measuring unit connected to a battery and configured to operate in a measurement mode during a predetermined measurement time at each preset measurement cycle and measure battery information including at least one of voltage and temperature of the battery while operating in the measurement mode; and a control unit configured to operate in a communication mode during a preset operation time at each preset communication cycle, receive the battery information from the measuring unit while operating in the communication mode, set a next operation time point at which the measuring unit is to operate in the measurement mode based on at least one of the communication cycle and the measurement time, and change the operation time to operate in the communication mode at each subsequent communication cycle based on the measurement time.

The measuring unit may be configured to operate in the measurement mode at the next operation time point to measure the battery information and operate in the measurement mode at each measurement cycle after measuring the battery information.

The control unit may be configured to set the next operation time point based on the measurement cycle so that the measuring unit operate in the measurement mode at an operation start point of the communication mode.

The operation time may be configured to be set in advance to correspond to the measurement cycle.

The control unit may be configured to change the operation time to correspond to the measurement time, after setting the next operation time point.

When the battery is provided in plurality, the measuring unit may be provided in plurality to respectively correspond to the plurality of batteries, each measuring unit being configured to operate at each measurement cycle to measure battery information of a corresponding battery among the plurality of batteries.

The control unit may be configured to set the next operation time point for each of the plurality of measuring units based on at least one of the communication cycle and the measurement time.

The control unit may be configured to calculate a time interval between an operation start point of the communication mode and an operation start point of the measurement mode for each of the plurality of measuring units and set the next operation time point for each of the plurality of measuring units based on the calculated time interval, the measurement cycle, and the measurement time.

The control unit may be configured to set the next operation time point for each of the plurality of measuring units according to Equation 1 below based on an identification number of each of the plurality of measuring units, $$T_{NEXT} = T_S - T_{GN} + \{(N-1) \times T_P\} \quad \text{[Equation 1]}$$

where $T_{NEXT}$ is the next operation time point, $T_S$ is the measurement cycle, N is an identification number set to each of the plurality of measuring units, which is a positive number, $T_{GN}$ is a time interval between the operation start point of the communication mode of the control unit and an operation start point of the measurement mode of the measuring unit whose identification number is N, and $T_P$ is the measurement time.

The control unit may be configured to set the next operation time point and then change the operation time based on the number of the plurality of measuring units and the measurement time.

The control unit may be configured to change the operation time according to Equation 2 below, $$T_Q = M \times T_P \quad \text{[Equation 2]}$$

where $T_Q$ is the operation time, M is the number of the plurality of measuring units, and $T_P$ is the measurement time.

The measuring unit may be configured to store the battery information measured at each preset measurement cycle and transmit all of the stored battery information to the control unit when the control unit operates in the communication mode while the measuring unit is operating in the measurement mode.

The control unit may be configured to set the next operation time point at each preset communication cycle.

The control unit may be configured to extract a voltage value and a temperature value of the battery from the received battery information, obtain a voltage comparison result by comparing the extracted voltage value with a reference voltage value, obtain a temperature comparison result by comparing the extracted temperature value with a reference temperature value, and diagnose a state of the battery based on at least one of the voltage comparison result and the temperature comparison result.

A battery management method according to another aspect of the present disclosure may comprise: a battery information measuring step of, by a measuring unit, operating in a measurement mode during a predetermined measurement time at each preset measurement cycle and measuring battery information including at least one of voltage and temperature of the battery while operating in the measurement mode; a battery information receiving step of, by a control unit, operating in a communication mode during a preset operation time at each preset communication cycle and receiving the battery information measured in the step of operating in the measurement mode while operating in the communication mode; an operation time point setting step of, by the control unit, setting a next operation time point at which the measuring unit is to operate in the measurement mode based on at least one of the communication cycle and the measurement time; and an operation time changing step of, by the control unit, changing the operation time to operate in the communication mode at each subsequent communication cycle based on the measurement time.

Advantageous Effects

According to one aspect of the present disclosure, by synchronizing the time point at which the measuring unit operates in the measurement mode and the time point at which the control unit operates in the communication mode, there is an advantage of dramatically reducing the power consumed while the control unit operates in the communication mode.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
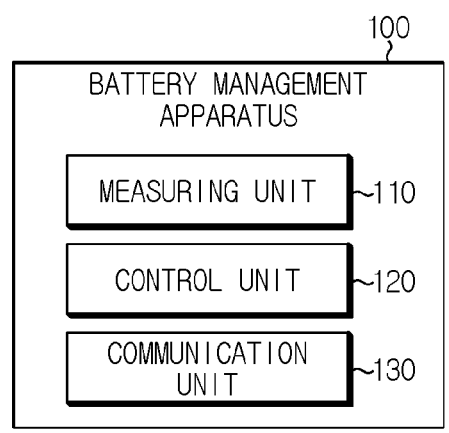
FIG. 1 is a diagram schematically showing a battery management apparatus according to an embodiment of the present disclosure.
Figure 2:
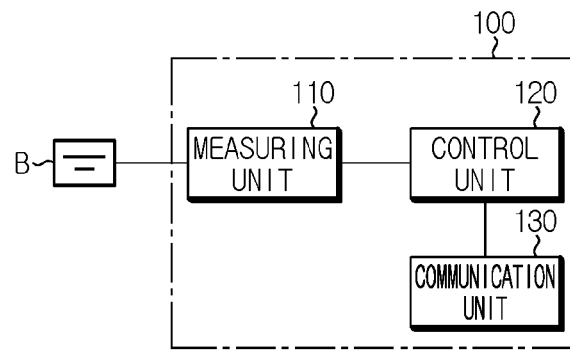
FIG. 2 is a diagram schematically showing an exemplarily configuration of the battery management apparatus according to an embodiment of the present disclosure.

FIG. 1 is a diagram schematically showing a battery management apparatus 100 according to an embodiment of the present disclosure. FIG. 2 is a diagram schematically showing an exemplarily configuration of the battery management apparatus 100 according to an embodiment of the present disclosure.

Referring to FIGS. 1 and 2, the battery management apparatus 100 according to an embodiment of the present disclosure may include a measuring unit 110 and a control unit 120.

The measuring unit 110 may be configured to be connected to a battery B.

Here, the battery B refers to one independent cell that has a negative electrode terminal and a positive electrode terminal and is physically separable. For example, one pouch-type lithium polymer cell may be regarded as the battery B. Alternatively, a battery module in which one or more cells are connected in series and/or in parallel may be regarded as the battery B.

In addition, the measuring unit 110 may be configured to operate in a measurement mode during a predetermined measurement time ($T_P$) at each preset measurement cycle ($T_S$).

Figure 3:
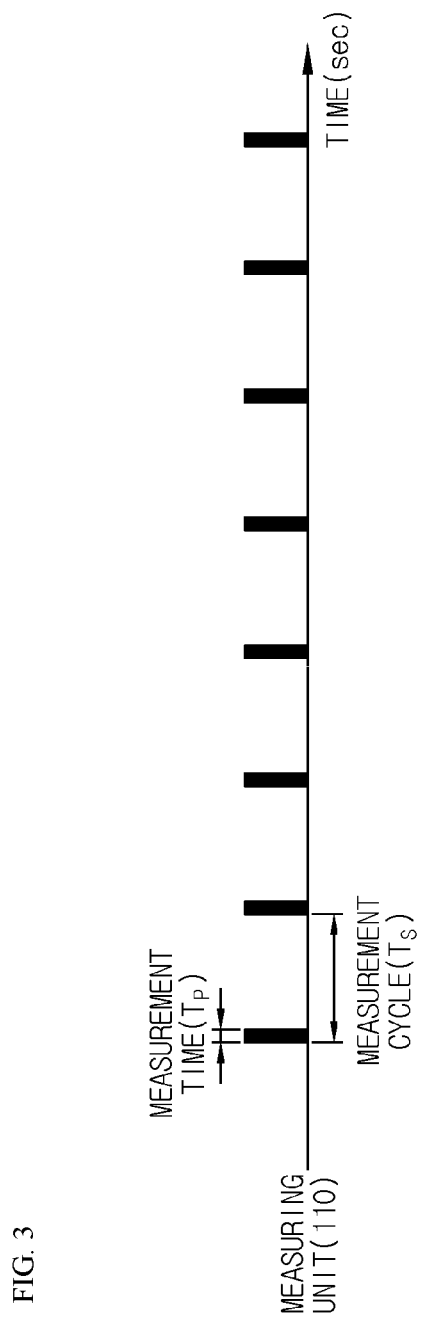
FIG. 3 is a diagram schematically showing the operation of a measuring unit of the battery management apparatus according to an embodiment of the present disclosure.

FIG. 3 is a diagram schematically showing the operation of the measuring unit 110 of the battery management apparatus 100 according to an embodiment of the present disclosure.

In the embodiment of FIG. 3, the measuring unit 110 may operate in a measurement mode in a region marked in black, and the measuring unit 110 may operate in a standby mode in a region not marked in black.

Specifically, the measuring unit 110 may operate in the measurement mode at each preset measurement cycle ($T_S$) and operate in the standby mode when it does not operate in the measurement mode. In addition, the measuring unit 110 may operate in the measurement mode during a predetermined measurement time ($T_P$).

In addition, the measuring unit 110 may be configured to measure battery information including at least one of voltage and temperature of the battery B while operating in the measurement mode.

For example, the measuring unit 110 may be connected to a positive electrode terminal and a negative electrode terminal of the battery B. In addition, the measuring unit 110 may measure a positive electrode voltage and a negative electrode voltage of the battery B, and calculate the difference between the measured positive electrode voltage and the measured negative electrode voltage to calculate the voltage of the battery B. In addition, the measuring unit 110 may be connected to the battery B to measure the temperature of the battery B.

For example, the battery B may be stored in a place such as a container for a certain period of time in a distribution process. If the measuring unit 110 cannot be connected to commercial power, the power that the measuring unit 110 may receive from a power supply provided in the container or the like or an auxiliary source provided in the measuring unit 110 may be limited. Therefore, in order to effectively use limited power, the measuring unit 110 does not measure the voltage and temperature of the battery B in the standby mode, but may measure the voltage and/or temperature of the battery B in the measurement mode.

The control unit 120 may be configured to operate in a communication mode during a preset communication cycle ($T_C$) at a preset operation time ($T_O$).

Figure 4:
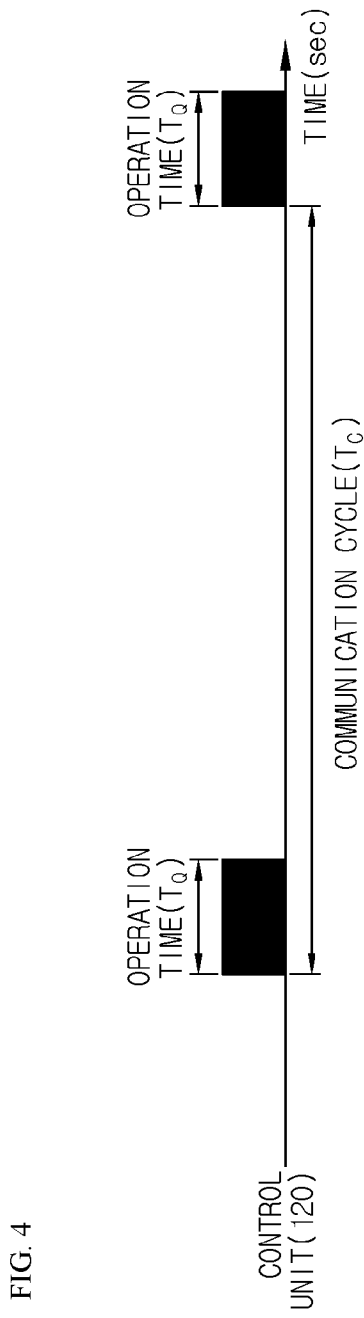
FIG. 4 is a diagram schematically showing the operation of a control unit of the battery management apparatus according to an embodiment of the present disclosure.

FIG. 4 is a diagram schematically showing the operation of the control unit 120 of the battery management apparatus 100 according to an embodiment of the present disclosure.

In the embodiment of FIG. 4, the control unit 120 may operate in the communication mode in a region marked in black, and the control unit 120 may operate in the standby mode in a region not marked in black.

Specifically, the control unit 120 operates in the communication mode at each preset communication cycle ($T_C$), and operate in the standby mode when it does not operate in the communication mode. In addition, the control unit 120 may operate in the communication mode during a predetermined operation time ($T_O$).

As in the former embodiment, in the distribution process of the battery B, the power that can be provided to the measuring unit 110 and the control unit 120 may be limited. Therefore, like the measuring unit 110, in order to effectively use the limited power, the control unit 120 may operate in the communication mode at each preset communication cycle ($T_C$) and operate in the standby mode other than the cycle.

In addition, the control unit 120 may be configured to receive the battery information from the measuring unit 110 while operating in the communication mode.

Preferably, while the control unit 120 is operating in the communication mode, the measuring unit 110 may operate in the measurement mode. That is, when the control unit 120 operates in the communication mode and the measuring unit 110 operates in the measurement mode, the control unit 120 and the measuring unit 110 may be connected to communicate with each other. To this end, the operation time ($T_O$) at which the control unit 120 operates in the communication mode may be preset to correspond to the measurement cycle ($T_S$) set in the measuring unit 110.

More preferably, the operation time ($T_O$) at which the control unit 120 operates in the communication mode may be the same as the measurement cycle ($T_S$) set in the measuring unit 110. In this case, while the control unit 120 operates in the communication mode, the measuring unit 110 has no choice but to operate in the measurement mode, and thus the control unit 120 may receive the battery information from the measuring unit 110.

The measurement time ($T_P$) during which the measuring unit 110 operates in the measurement mode may be significantly shorter than the measurement cycle ($T_S$) set in the measuring unit 110. That is, the measuring unit 110 may operate in the standby mode for most of one cycle, and operate in the measurement mode only during the measurement time ($T_P$) to measure the battery information. In this case, in a situation in which commercial power is not connected to the measuring unit 110, in order for the measuring unit 110 to efficiently use limited power to measure the battery information, it is preferable that the measurement cycle ($T_S$) to operate in the measurement mode is set to be relatively longer than the measurement time ($T_P$) and the measurement time ($T_P$) is set to be relatively shorter than the measurement cycle ($T_S$). For example, the measurement cycle ($T_S$) set in the measuring unit 110 may be 1 [h], and the measurement time ($T_P$) when the measuring unit 110 operates in the measurement mode may be 100 [ms].

In addition, the operation time ($T_O$) during which the control unit 120 operates in the communication mode may be significantly shorter than the communication cycle ($T_C$) set in the control unit 120. That is, the control unit 120 may operate in the standby mode for most of one cycle, and operate in the communication mode only during the operation time ($T_O$) to receive the battery information from the measuring unit 110. Like the measuring unit 110, in order for the control unit 120 to efficiently communicate with the measuring unit 110 using limited power in a situation where commercial power is not connected to the control unit 120, it is preferable that the communication cycle ($T_C$) at which the control unit 120 operates in the communication mode is set to be relatively longer than the operation time ($T_O$) and the operation time ($T_O$) is set to be relatively shorter than the communication cycle ($T_C$). For example, the communication cycle ($T_C$) set in the control unit 120 may be 6 [h], and the operation time ($T_O$) during which the control unit 120 operates in the communication mode may be 1 [h].

Here, since the control unit 120 has to perform communication with the measuring unit 110 at least once during the operation time ($T_O$) to operate in the operation mode, the operation time ($T_O$) may be set to be equal to or greater than the measurement cycle ($T_S$) set in the measuring unit 110. Preferably, the operation time ($T_O$) of the control unit 120 and the measurement cycle ($T_S$) of the measuring unit 110 may be set to be the same. For example, the operation time ($T_O$) set in the control unit 120 and the measurement cycle ($T_S$) set in the measuring unit 110 may be 1 [h]. In addition, the control unit 120 may receive the battery information from the measuring unit 110 during the measurement time ($T_P$, 100 [ms]) when the measuring unit 110 operates in the measurement mode.

In addition, the control unit 120 may be configured to set a next operation time point at which the measuring unit 110 is to operate in the measurement mode based on at least one of the communication cycle ($T_C$) and the measurement time ($T_P$).

For example, the control unit 120 may be configured to set the next operation time point based on the measurement cycle ($T_S$) so that the measuring unit 110 operates in the measurement mode at the operation start point of the communication mode. That is, after the control unit 120 receives the battery information from the measuring unit 110, the next operation time point of the measuring unit 110 may be set so that the measuring unit 110 operates in the measurement mode at a time point when the control unit 120 starts to operate in the communication mode in the next communication cycle ($T_C$).

That is, since the next operation time point of the measuring unit 110 is set by the control unit 120, the measuring unit 110 may operate in the measurement mode at the same time point as the time point at which the control unit 120 operates in the communication mode in the next communication cycle ($T_C$).

In addition, the control unit 120 may be configured to change the operation time ($T_O$) to operate in the communication mode at each subsequent communication cycle ($T_C$) based on the measurement time ($T_P$).

For example, it is assumed that the operation time ($T_O$) during which the control unit 120 operates in the communication mode is initially set to 1 [h] identical to the measurement cycle ($T_S$) of the measuring unit 110 and the measurement time ($T_P$) during which the measuring unit 110 operates in the measurement mode is 100 [ms]. In this case, if the measuring unit 110 does not operate in the measurement mode at the operation start point where the control unit 120 operates in the communication mode, the control unit 120 has to operate in the communication mode during 1 [h] at the maximum at each communication cycle ($T_C$) in order to receive the battery information from the measuring unit 110. In addition, if the next operation time point of the measuring unit 110 is not changed, in order to receive the battery information for 100 [ms] during which the measuring unit 110 operates in the measurement mode, the control unit 120 has to operate in the communication mode for 1 [h] at each communication cycle ($T_C$).

Accordingly, the control unit 120 may set the next operation time point of the measuring unit 110 so that the measuring unit 110 operates in the measurement mode at the operation start point to operate in the communication mode. That is, since the control unit 120 may operate in the communication mode and the measuring unit 110 may operate in the measurement mode at the same time point from the next communication cycle ($T_C$), the control unit 120 may receive the battery information from the measuring unit 110 even if it operates in the communication mode only during the measurement time ($T_P$, 100 [ms]) during which the measuring unit 110 operates in the measurement mode. That is, since the next operation time point of the measuring unit 110 is set by the control unit 120, the operation time ($T_O$) during which the control unit 120 operates in the communication mode may be reduced from 1 [h] to 100 [ms].

The battery management apparatus 100 according to an embodiment of the present disclosure has an advantage of dramatically saving the power consumed while the control unit 120 is operating in the communication mode, by synchronizing the time point at which the measuring unit 110 operates in the measurement mode and the time point at which the control unit 120 operates in the communication mode.

Meanwhile, the control unit 120 provided to the battery management apparatus 100 according to an embodiment of the present disclosure may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 120 may be implemented as a set of program modules. At this time, the program module may be stored in a memory and executed by the control unit 120. The memory may be located inside or out of the control unit 120 and may be connected to the control unit 120 by various well-known means.

Hereinafter, the operation of the battery management apparatus 100 will be described in more detail with reference to a comparative example of FIG. 5 and an example of FIG. 6.

Figure 5:
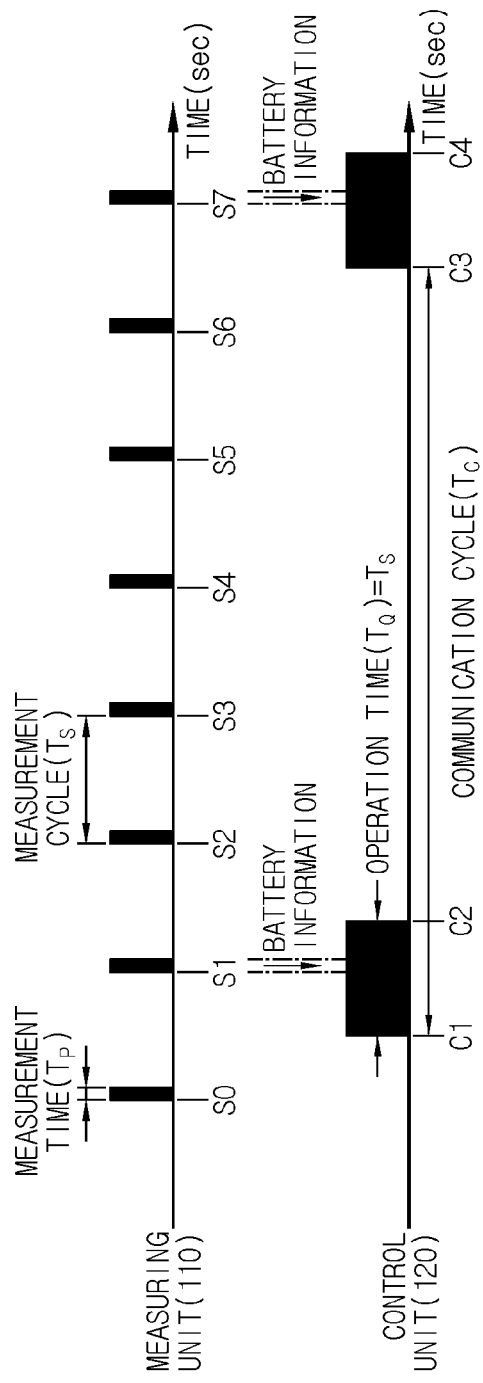
FIG. 5 is a first comparative example schematically showing the operation of the battery management apparatus according to an embodiment of the present disclosure.

FIG. 5 is a first comparative example schematically showing the operation of the battery management apparatus 100 according to an embodiment of the present disclosure. Specifically, FIG. 5 is a diagram illustrating a comparative example in which the next operation time point of the measuring unit 110 and the operation time ($T_Q$) of the control unit 120 are not changed.

Figure 6:
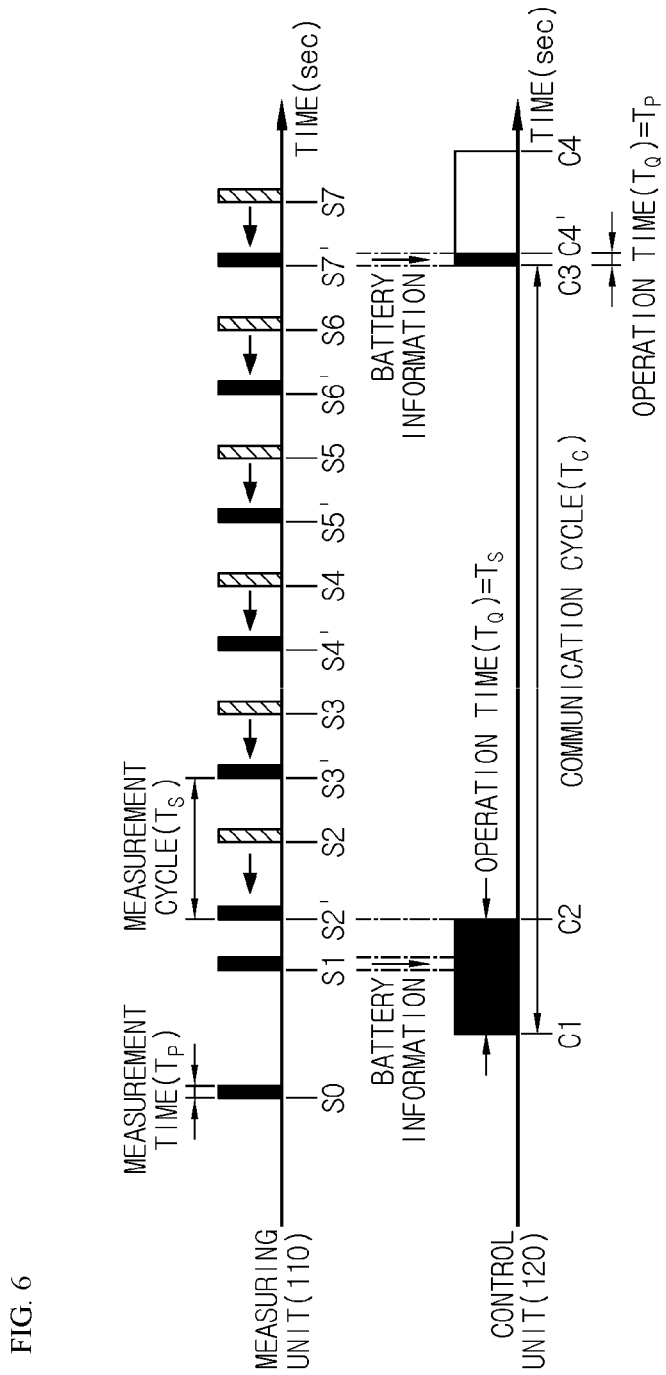
FIG. 6 is a first example schematically showing the operation of the battery management apparatus according to an embodiment of the present disclosure.

FIG. 6 is a first example schematically showing the operation of the battery management apparatus 100 according to an embodiment of the present disclosure. Specifically, FIG. 6 is a diagram showing an example in which the next operation time point of the measuring unit 110 and the operation time ($T_Q$) of the control unit 120 are changed according to the present disclosure.

In the comparative example of FIG. 5, the control unit 120 may operate in the communication mode at a time point C1 and a time point C3. That is, referring to FIGS. 4 and 5, an interval between time points C1 and C2 and an interval between time points C3 and C4 may be the operation time ($T_Q$) during which the control unit 120 operates in the communication mode. In addition, the interval between the time points C1 and C3 may be the communication cycle ($T_C$) of the control unit 120. In addition, the measuring unit 110 may operate in the measurement mode at each of time points S0 to S7. Here, the interval between the time points S0 and S1, the interval between the time points S1 and S2, the interval between the time points S2 and S3, the interval between the time points S3 and S4, the interval between the time points S4 and S5, the interval between the time points S5 and S6 and the interval between the time points S6 and S7 may be the measurement cycle ($T_S$) of the measuring unit 110. Here, the operation time ($T_Q$) during which the control unit 120 operates in the communication mode may be the same as the measurement cycle ($T_S$) of the measuring unit 110.

Specifically, the control unit 120 may operate in the communication mode during a time corresponding to the measurement cycle ($T_S$) of the measuring unit 110 in order to receive the battery information from the measuring unit 110. That is, since the communication cycle ($T_C$) of the control unit 120 and the measurement cycle ($T_S$) of the measuring unit 110 are not adjusted to correspond to each other, the control unit 120 has to operate in the communication mode during more time than required to actually receive the battery information, in order to receive the battery information from the measuring unit 110.

For example, in the comparative example of FIG. 5, the time point C1 and the time point C3 during which the control unit 120 operates in the communication mode are not the same as the time point S1 and the time point S7 during which the measuring unit 110 operates in the measurement mode, respectively, so the control unit 120 has a problem in that it has to operate in the communication mode for a time corresponding to the measurement cycle ($T_S$) of the measuring unit 110.

Meanwhile, in the example of FIG. 6, the control unit 120 may receive the battery information from the measuring unit 110 and set the next operation time point of the measuring unit 110 while operating in the communication mode at the time points C1 and C2. Specifically, the control unit 120 may set an operation end time point of the communication mode as the next operation time point of the measuring unit 110. That is, the operation end time point C2 of the communication mode of the control unit 120 and the next operation time point S2' of the measuring unit 110 may be the same.

Specifically, the region indicated by hatched line in the example of FIG. 6 coincides with the time point at which the measuring unit 110 operates in the measurement mode in the comparative example of FIG. 5. That is, if comparing FIGS. 5 and 6, the measuring unit 110 in the comparative example of FIG. 5 operates in the measurement mode at the time points S2, S3, S4, S5, S6, and S7, whereas the measuring unit 110 in the example of FIG. 6 may operate in the measurement mode at the time points S2', S3', S4', S5', S6', and S7'.

In addition, in the example of FIG. 6, the communication mode operation start point (C3) of the next communication cycle ($T_C$) of the control unit 120 and the measurement mode operation start point (S7') of the measuring unit 110 may be the same as each other. This is because the control unit 120 has changed the next operation time point at which the measuring unit 110 is to operate in the measurement mode from S2 to S2' in consideration of the communication cycle ($T_C$) and the measurement time ($T_P$).

Specifically, the measuring unit 110 may be configured to operate in the measurement mode at the next operation time point to measure the battery information, and to operate in the measurement mode at each the measurement cycle ($T_S$) after measuring the battery information.

For example, referring to FIGS. 3 and 6, the measurement cycle ($T_S$) of the measuring unit 110 itself is maintained in the same way as before, but at the next operation time point set by the control unit 120, the measuring unit 110 operates in the measurement mode. Therefore, at the same time point (C3 and S7'), the control unit 120 may operate in the communication mode and the measuring unit 110 may operate in the measurement mode.

Also, the control unit 120 may be configured to change the operation time ($T_Q$) to correspond to the measurement time ($T_P$), after setting the next operation time point.

Specifically, after setting the next operation time point for the measuring unit 110, the control unit 120 may change the operation time ($T_Q$) to operate in the communication mode to become the same as the measurement time ($T_P$) when the measuring unit 110 operates in the measurement mode.

For example, since the control unit 120 may know the time point at which the measuring unit 110 starts operating in the measurement mode and the measurement time ($T_P$) at which the measuring unit 110 operates in the measurement mode based on the measurement cycle ($T_S$), the operation time ($T_Q$) to operate in the communication mode may be set equal to the measurement time ($T_P$) in which the measuring unit 110 operates in the measurement mode from the subsequent communication cycle ($T_C$). That is, since the measuring unit 110 may also operate in the measurement mode during the operation time ($T_Q$) when the control unit 120 operates in the communication mode, the control unit 120 may receive the battery information from the measuring unit 110 even if the operation time ($T_Q$) is changed to become the same as the measurement time ($T_P$).

Therefore, according to an embodiment of the present disclosure, there is an advantage of reducing unnecessary power consumption in a situation where the power provided is limited, such as in the distribution process of the battery B, by synchronizing the time point at which the measuring unit 110 operates in the measurement mode and the time point at which the control unit 120 operates in the communication mode and reducing the operation time ($T_Q$) at which the control unit 120 operates in the communication mode.

Figure 7:
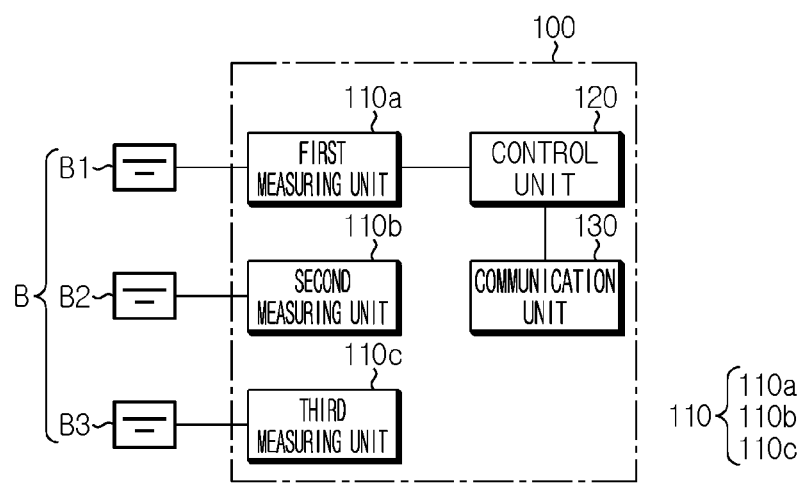
FIG. 7 is a diagram schematically showing another exemplarily configuration of the battery management apparatus according to an embodiment of the present disclosure.

FIG. 7 is a diagram schematically showing another exemplarily configuration of the battery management apparatus 100 according to an embodiment of the present disclosure.

Specifically, FIG. 7 is a diagram schematically showing an example in which a plurality of measuring units 110 are provided in the battery management apparatus 100 so as to correspond to a plurality of batteries B, respectively.

When a plurality of the batteries B are provided, the measuring unit 110 may be provided in plurality to correspond to the plurality of batteries B, respectively.

For example, in the example of FIG. 7, it is assumed that a first battery B1, a second battery B2, a third battery B3 are provided. The battery management apparatus 100 may include a first measuring unit 110a corresponding to the first battery B1, a second measuring unit 110b corresponding to the second battery B2, and a third measuring unit 110c corresponding to the third battery B3.

In addition, the measuring unit 110 may be configured to measure battery information of a corresponding battery B among the plurality of batteries B by operating at each measurement cycle ($T_S$).

Specifically, the plurality of measuring units 110 may operate in the measurement mode at each set measurement cycle ($T_S$) to measure the battery information of the corresponding battery B.

Preferably, in the example of FIG. 7, the measurement cycle ($T_S$) and the measurement time ($T_P$) set in the first measuring unit 110a, the second measuring unit 110b, and the third measuring unit 110c may be the same. However, the time points at which the first measuring unit 110a, the second measuring unit 110b, and the third measuring unit 110c respectively operate in the measurement mode may be different from each other or the same as each other.

For example, when the first measuring unit 110a, the second measuring unit 110b, and the third measuring unit 110c operate at the same time point in the measurement mode, communication interference may occur while the control unit 120 is receiving the battery information from the first measuring unit 110a, the second measuring unit 110b, and the third measuring unit 110c. Accordingly, more preferably, the first measuring unit 110a, the second measuring unit 110b, and the third measuring unit 110c may operate in the measurement mode at different time points.

The control unit 120 may be configured to set the next operation time point for each of the plurality of measuring units 110 based on at least one of the communication cycle ($T_C$) and the measurement time ($T_P$).

Specifically, the control unit 120 may set a next operation time point for each of the plurality of measuring units 110 based on the communication cycle ($T_C$) to operate in the communication mode and the measurement time ($T_P$) in which each of the plurality of measuring units 110 operates in the measurement mode.

Figure 8:
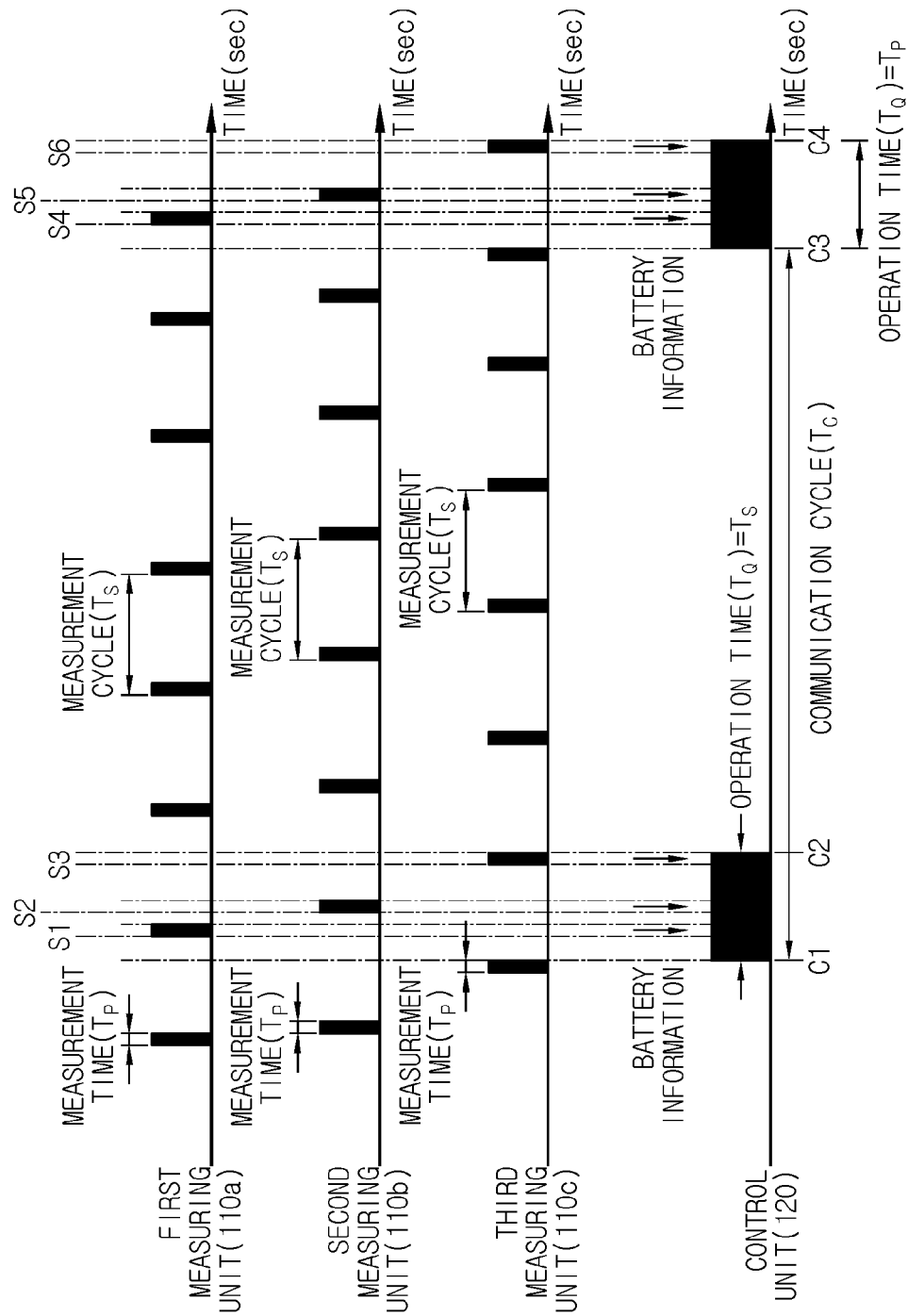
FIG. 8 is a second comparative example schematically showing the operation of the battery management apparatus according to an embodiment of the present disclosure.

FIG. 8 is a second comparative example schematically showing the operation of the battery management apparatus 100 according to an embodiment of the present disclosure. Specifically, FIG. 8 is a diagram showing a comparative example in which the next operation time point of the plurality of measuring units 110 and the operation time ($T_O$) of the control unit 120 are not changed.

Figure 9:
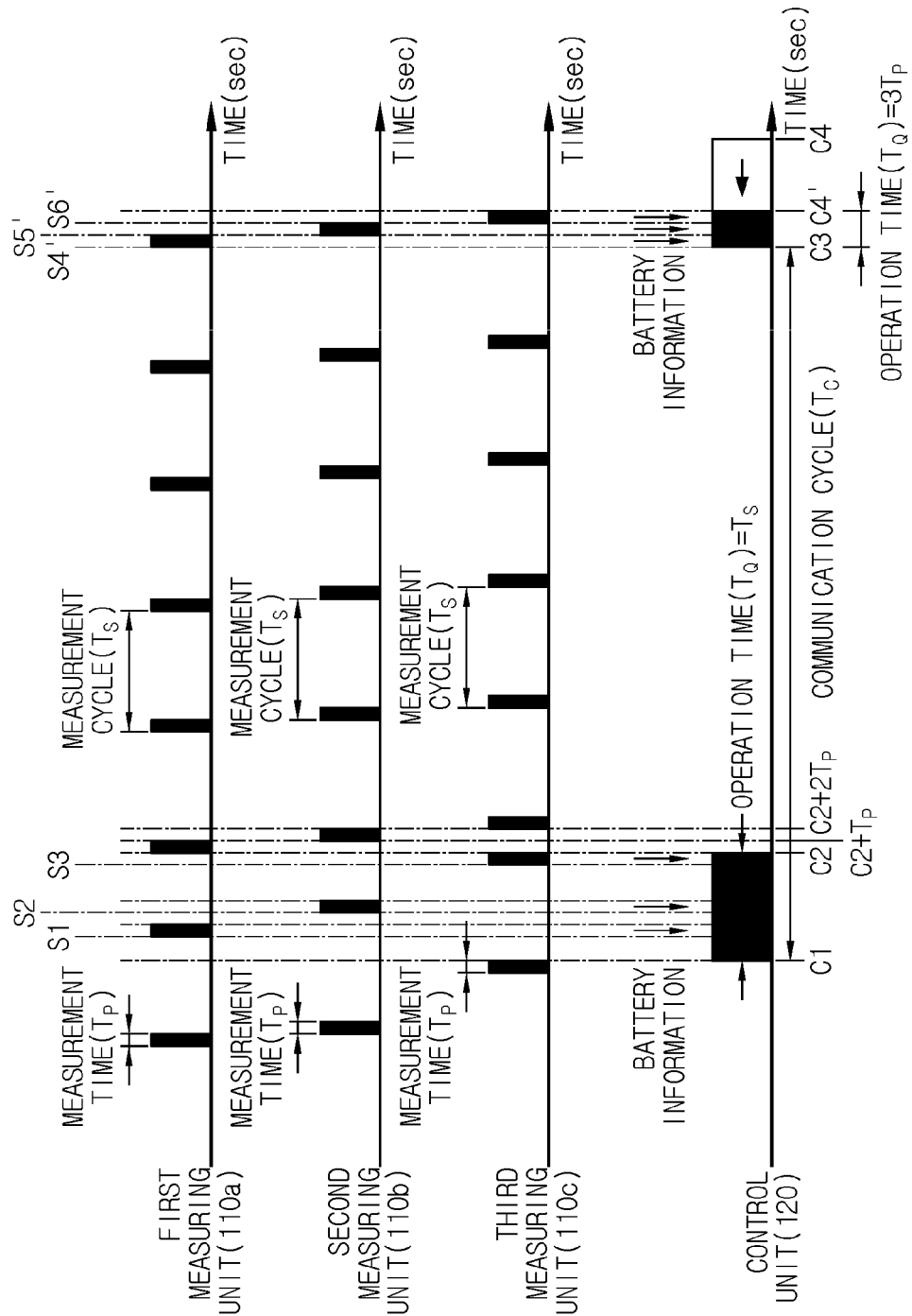
FIG. 9 is a second example schematically showing the operation of the battery management apparatus according to an embodiment of the present disclosure.

FIG. 9 is a second example schematically showing the operation of the battery management apparatus 100 according to an embodiment of the present disclosure. Specifically, FIG. 9 is a diagram showing an example in which the next operation time point of the measuring unit 110 and the operation time ($T_O$) of the control unit 120 are changed according to the present disclosure.

In the comparative example of FIG. 8, the control unit 120 may operate in the communication mode at the time point C1. Specifically, the control unit 120 may operate in the communication mode during the operation time ($T_O$) at the time point C1. In addition, the first measuring unit 110a, the second measuring unit 110b, and the third measuring unit 110c may operate in the measurement mode during the measurement time ($T_P$) at the time point S1, the time point S2, and the time point S3, respectively. That is, the control unit 120 may operate in the communication mode from the time point C1 to the time point C2 in order to receive the battery information from each of the first measuring unit 110a, the second measuring unit 110b, and the third measuring unit 110c.

Thereafter, in the comparative example of FIG. 8, the control unit 120 may operate in the communication mode again at the time point C3. That is, the interval between the time point C1 and the time point C3 may be the same as the communication cycle ($T_C$). In this case, since the next operation time point for each of the first measuring unit 110a, the second measuring unit 110b, and the third measuring unit 110c is not set by the control unit 120 and the operation time ($T_O$) of the control unit 120 is not changed, there is a problem that the control unit 120 has to operate in the communication mode during the measurement time ($T_P$) in order to receive the battery information from each of the first measuring unit 110a, the second measuring unit 110b, and the third measuring unit 110c.

In the example of FIG. 9, like the comparative example of FIG. 8, the control unit 120 may operate in the communication mode from the time point C1 to the time point C2 to receive the battery information from each of the first measuring unit 110a, the second measuring unit 110b, and the third measuring unit 110c.

Meanwhile, unlike the comparative example of FIG. 8, in the example of FIG. 9, the control unit 120 may set the next operation time point for each of the first measuring unit 110a, the second measuring unit 110b, and the third measuring unit 110c. That is, the next operation time point at which the first measuring unit 110a operates in the measurement mode may be set to the time point C2, the next operation time point at which the second measuring unit 110b operates in the measurement mode may be set to the time point C2+$T_P$, and the next operation time point at which the third measuring unit 110c operates in the measurement mode may be set to the time point C2+2$T_P$.

Thereafter, the first measuring unit 110a may operate in the measurement mode at the time point C2, and then may operate in the measurement mode at each measurement cycle ($T_S$) based on the time point C2. In addition, the second measuring unit 110b may operate in the measurement mode at the time point C2+$T_P$, and then operate in the measurement mode at each measurement cycle ($T_S$) based on the time point C2+$T_P$. In addition, the third measuring unit 110c may operate in the measurement mode at the time point C2+2$T_P$, and then operate in the measurement mode at each measurement cycle ($T_S$) based on the time point C2+2$T_P$.

Here, the control unit 120 may be configured to set the next operation time point for each of the plurality of measuring units 110 according to Equation 1 below, based on an identification number of each of the plurality of measuring units 110.

$$T_{NEXT} = T_S - T_{GN} + \{(N-1) \times T_P\} \qquad \text{[Equation 1]}$$

Here, $T_{NEXT}$ is the next operation time point, $T_S$ is the measurement cycle ($T_S$), N is an identification number set to each of the plurality of measuring units 110, which is a positive number, $T_{GN}$ is a time interval between the operation start point of the communication mode of the control unit 120 and an operation start point of the measurement mode of the measuring unit 110 whose identification number is N, and $T_P$ is the measurement time ($T_P$).

Hereinafter, in the example of FIG. 9, it is assumed that the identification number of the first measuring unit 110a is 1, the identification number of the second measuring unit 110b is 2, and the identification number of the third measuring unit 110c is 3.

Specifically, the control unit 120 may be configured to calculate a time interval between the operation start point of the communication mode and the operation start point of the measurement mode for each of the plurality of measuring units 110, and set the next operation time point for each of the plurality of measuring units 110 based on the calculated time interval, the measurement cycle ($T_S$), and the measurement time ($T_P$).

In the example of FIG. 9, the operation start point of the communication mode of the control unit 120 is the time point C1. In addition, the operation start point of the measurement mode of the first measuring unit 110a is S1. Referring to Equation 1, $T_{GN}$ for the first measuring unit 110a calculated by the control unit 120 is "S1−C1". That is, the next operation time point ($T_{NEXT}$) for the first measuring unit 110a calculated by the control unit 120 may be calculated according to the formula "$T_S$−(S1−C1)". Here, the measurement cycle ($T_S$) is "C2−C1" because it is the same as the operation time ($T_Q$) in which the control unit 120 operates in the communication mode. That is, the next operation time point ($T_{NEXT}$) for the first measuring unit 110a calculated by the control unit 120 is "C2−S1" calculated according to the formula "(C2−C1)−(S1−C1)". Accordingly, the first measuring unit 110a may operate in the measurement mode after the time point "C2−S1" from the time point S1. That is, the first measuring unit 110a may operate in the measurement mode at the time point C2 according to the formula "S1+(C2 S1)".

Similarly, in the example of FIG. 9, the operation start point of the measurement mode of the second measuring unit 110b is S2. Referring to Equation 1, $T_{GN}$ for the second measuring unit 110b calculated by the control unit 120 is "S2−C1". That is, the next operation time point ($T_{NEXT}$) for the second measuring unit 110b calculated by the control unit 120 may be calculated according to the formula "$T_S$−(S2−C1)+$T_P$". Here, the measurement cycle ($T_S$) is "C2−C1" because it is the same as the operation time ($T_Q$) in which the control unit 120 operates in the communication mode. That is, the next operation time point ($T_{NEXT}$) for the second measuring unit 110b calculated by the control unit 120 is "C2−S2+$T_P$" calculated according to the formula "(C2−C1)−(S2−C1)+$T_P$". Accordingly, the second measuring unit 110b may operate in the measurement mode after the time point "C2−S2+$T_P$" from the time point S2. That is, the first measuring unit 110a may operate in the measurement mode at the time point C2+$T_P$ according to the formula "S2+(C2−S2)+$T_P$".

Similarly, in the example of FIG. 9, the operation start point of the measurement mode of the third measuring unit 110c is S3. Referring to Equation 1, $T_{GN}$ for the third measuring unit 110c calculated by the control unit 120 is "S3−C1". That is, the next operation time point ($T_{NEXT}$) for the third measuring unit 110c calculated by the control unit 120 may be calculated according to the formula "$T_S$−(S3−C1)+2$T_P$". Here, the measurement cycle ($T_S$) is "C2−C1" because it is the same as the operation time ($T_Q$) in which the control unit 120 operates in the communication mode. That is, the next operation time point ($T_{NEXT}$) for the third measuring unit 110c calculated by the control unit 120 is "C2−S3+2$T_P$" calculated according to the formula "(C2−C1)−(S3−C1)+2$T_P$". Accordingly, the third measuring unit 110c may operate in the measurement mode after the time point "C2−S3+2$T_P$" from the time point S3. That is, the third measuring unit 110c may operate in the measurement mode at the time point C2+2$T_P$ according to the formula "S3+(C2−S3)+2$T_P$".

Thereafter, the control unit 120 may be configured to change the operation time ($T_Q$) based on the number of the plurality of measuring units 110 and the measurement time ($T_P$) after setting the next operation time point.

Specifically, the control unit 120 may be configured to change the operation time ($T_Q$) according to Equation 2 below.

$$T_Q = M \times T_P \quad \text{[Equation 2]}$$

Here, $T_Q$ is the operation time ($T_Q$), M is the number of the plurality of measuring units 110, and $T_P$ is the measurement time ($T_P$).

In the example of FIG. 9, the number of the plurality of measuring units 110 is 3. Therefore, referring to Equation 2, the control unit 120 may change the operation time ($T_Q$) to operate in the communication mode from the next communication cycle ($T_C$) to 3$T_P$ according to the formula "3×$T_P$". That is, in the initial communication cycle ($T_C$), the operation time ($T_Q$) of the control unit 120 is set to "C2−C1" in the same way as the measurement cycle ($T_S$) of the measuring unit 110, but from the next communication cycle ($T_C$), the operation time ($T_Q$) of the control unit 120 may be significantly reduced to "3$T_P$".

Therefore, according to an embodiment of the present disclosure, the power consumed while the control unit 120 operates in the communication mode may be significantly saved. In addition, referring to the comparative example of FIG. 8 and the example of FIG. 9, since the measurement cycle ($T_S$) of the measuring unit 110 and the communication cycle ($T_C$) of the control unit 120 are not changed, there is an advantage that battery information may be measured equally while the power consumed by the control unit 120 is significantly reduced.

The measuring unit 110 may be configured to store the battery information measured at each preset measurement cycle ($T_S$).

In addition, if the control unit 120 operates in the communication mode while the measuring unit 110 is operating in the measurement mode, the measuring unit 110 may be configured to transmit all of the stored battery information to the control unit 120.

In general, since the measuring unit 110 is a sensing module, a storage space capable of storing the measured battery information may be smaller than that of the control unit 120. Accordingly, the measuring unit 110 may store the measured battery information at each measurement cycle ($T_S$), and transmit all of the stored battery information to the control unit 120 when the control unit 120 operates in the communication mode. Thereafter, the measuring unit 110 may secure a storage space for storing new battery information by deleting the stored battery information.

Alternatively, unlike the example of FIG. 9, it is assumed that the communication cycle ($T_C$) of the control unit 120 is increased than before in order to reduce the power consumed for the control unit 120 to operate in the communication mode. In this case, since the number of times the control unit 120 operates in the communication mode is reduced, power consumption may be reduced. However, as the number of times the control unit 120 operates in the communication mode is reduced, the battery information to be stored by the measuring unit 110 may be increased. That is, a larger storage space may be required for the measuring unit 110. Therefore, in this case, there is a problem that the price of the measuring unit 110 included in the battery management apparatus 100 may increase. Also, unlike the example of FIG. 9, assuming that hundreds of batteries B are distributed, the battery management apparatus 100 requires hundreds of measuring units 110 to correspond to the batteries B, respectively. In this case, there is a problem that the price of the battery management apparatus 100 (specifically, the total price for several hundred measuring units 110) may be significantly increased.

In contrast, the battery management apparatus 100 according to an embodiment of the present disclosure may synchronize a time point at which each of the plurality of measuring units 110 operates in the measurement mode and a time point at which the control unit 120 operates in the communication mode, and the control unit 120 may appropriately change the operation time ($T_O$) in which the control unit 120 operates in the communication mode. Therefore, according to an embodiment of the present disclosure, there is an advantage in that limited power can be efficiently used and the battery management apparatus 100 can be provided at a reasonable price.

The control unit 120 may be configured to set the next operation time point at each preset communication cycle ($T_C$).

In an ideal state, when the next operation time point of the measuring unit 110 is set by the control unit 120, the measuring unit 110 may operate in the measurement mode at each preset measurement cycle ($T_S$) based on the set next operation time point. However, in an actual situation, an error may occur in the measurement cycle ($T_S$) in which the measuring unit 110 operates in the measurement mode or the communication cycle ($T_C$) in which the control unit 120 operates in the communication mode due to the time when the operation mode of the measuring unit 110 is changed from the standby mode to the measurement mode, the time when the operation mode of the control unit 120 is changed from the standby mode to the communication mode, or the like. Accordingly, the control unit 120 may be configured to set the next operation time point of the measuring unit 110 at each communication cycle ($T_C$) in order to prevent such an error from occurring in advance.

The control unit 120 may be configured to extract a voltage value and a temperature value of the battery B from the received battery information.

In addition, the control unit 120 may be configured to obtain a voltage comparison result by comparing the extracted voltage value with a reference voltage value and obtain a temperature comparison result by comparing the extracted temperature value with a reference temperature value.

Here, the reference voltage value is a voltage value serving as a criterion for diagnosing the state of the battery B as an abnormal state, and may be a preset value. In addition, the reference temperature value is a temperature value serving as a criterion for diagnosing the state of the battery B as an abnormal state, and may be a preset value. In addition, the reference voltage value and the reference temperature value may be stored in a memory of the control unit 120.

Specifically, the control unit 120 may obtain the voltage comparison result by comparing the magnitude between the extracted voltage value and the reference voltage value. In addition, the control unit 120 may obtain the temperature comparison result by comparing the magnitude between the extracted temperature value and the reference temperature value.

In addition, the control unit 120 may be configured to diagnose the state of the battery B based on at least one of the voltage comparison result and the temperature comparison result.

Specifically, when the extracted voltage value is equal to or less than the reference voltage value or when the extracted temperature value is equal to or less than the reference temperature value, the control unit 120 may diagnose the state of the corresponding battery B as an abnormal state.

In addition, referring to FIGS. 1 and 2, the battery management apparatus 100 according to an embodiment of the present disclosure may include a communication unit 130.

The communication unit 130 may be configured to output the battery information received by the control unit 120 from the measuring unit 110 to the outside.

Specifically, the communication unit 130 may be configured to be able to communicate with an external server and/or a diagnostic device. In addition, the communication unit 130 may transmit the battery information received by the control unit 120 to an external server and/or a diagnosis device. In this case, the external server and/or the diagnosis device may receive the battery information from the communication unit 130 and diagnose the state of the battery based on the received battery information, the reference voltage value, and the reference temperature value.

For example, the external server may be a cloud server, and the diagnosis device may be a battery management system (BMS).

That is, according to an embodiment of the present disclosure, since the battery information obtained by the battery management apparatus is stored in an external server and/or an external device, the state history of the battery in the distribution process may be effectively stored. In addition, since the state of the battery may be diagnosed by an external server and/or an external device, the state history of the battery and the state diagnosis result of the battery may be effectively stored and managed.

Figure 10:
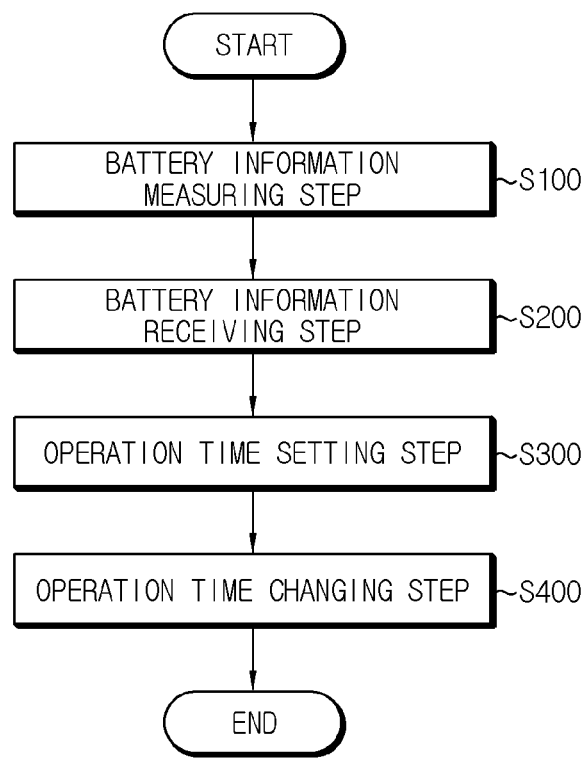
FIG. 10 is a diagram schematically showing a battery management method according to another embodiment of the present disclosure.

FIG. 10 is a diagram schematically showing a battery management method according to another embodiment of the present disclosure.

Each step of the battery management method according to another embodiment of the present disclosure may be performed by the battery management apparatus 100 according to an embodiment of the present disclosure.

Hereinafter, for convenience of description, content overlapping with the previously described content will be briefly described or omitted.

Referring to FIG. 10, the battery management method may include a battery information measuring step (S100), a battery information receiving step (S200), an operation time point setting step (S300), and an operation time changing step (S400).

The battery information measuring step (S100) is a step of operating in a measurement mode during a predetermined measurement time ($T_P$) at each preset measurement cycle ($T_S$) and measuring battery information including at least one of voltage and temperature of a corresponding battery B while operating in the measurement mode, and may be performed by the measuring unit 110.

For example, in the embodiment of FIG. 3, the measuring unit 110 may operate in the measurement mode during the measurement time ($T_P$) at each measurement cycle ($T_S$). In addition, the measuring unit 110 may measure battery information including at least one of the voltage and temperature of the connected battery B while operating in the measurement mode.

The battery information receiving step (S200) is a step of operating in a communication mode during a preset operation time ($T_Q$) at each preset communication cycle ($T_C$) and receiving the battery information measured in the step of operating in the measurement mode while operating in the communication mode, and may be performed by the control unit 120.

For example, in the embodiment of FIG. 4, the control unit 120 may operate in the communication mode during the operation time ($T_Q$) at each communication cycle ($T_C$). In addition, while the control unit 120 is operating in the communication mode, the control unit 120 may receive the battery information from the measuring unit 110 operating in the measurement mode.

The operation time point setting step (S300) is a step of setting a next operation time point at which the measuring unit 110 is to operate in the measurement mode based on at least one of the communication cycle ($T_C$) and the measurement time ($T_P$), and may be performed by the control unit 120.

Specifically, after receiving the battery information from the measuring unit 110, the control unit 120 may set the next operation time point at which the measuring unit 110 should operate in the communication mode by using Equation 1 described above.

For example, in the example of FIG. 6, the control unit 120 may set the next operation time point of the measuring unit 110 to the time point S2' that is the same as the time point C2.

As another example, in the example of FIG. 9, the control unit 120 may set the next operation time point of the first measuring unit 110a to the time point C2, set the next operation time point of the second measuring unit 110b to time point C2+$T_P$, and set the next operation time point of the third measuring unit 110c to the time point C2+2$T_P$.

The operation time changing step (S400) is a step of changing the operation time ($T_Q$) to operate in the communication mode at each subsequent communication cycle ($T_C$) based on the measurement time ($T_P$), and may be performed by the control unit 120.

Specifically, the control unit 120 may set the operation time ($T_Q$) to operate in the communication mode at each subsequent communication cycle ($T_C$) to be the same as the measurement time ($T_P$) in which the measuring unit 110 operates in the measurement mode.

For example, in the example of FIG. 6, the control unit 120 may set the operation time ($T_Q$) to be the same as the measurement time ($T_P$) of the measuring unit 110.

As another example, in the example of FIG. 9, the control unit 120 may set the operation time ($T_Q$) to 3$T_P$, which is the sum of the measurement times ($T_P$) of the first measuring unit 110a, the second measuring unit 110b, and the third measuring unit 110c.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

100: battery management apparatus
110: measuring unit
110a: first measuring unit
110b: second measuring unit
110c: third measuring unit
120: control unit
130: communication unit
B: battery
B1: first battery
B2: second battery
B3: third battery

What is claimed is:

1. A battery management apparatus, comprising:
a measuring unit connected to a battery and configured to operate in a measurement mode during a predetermined measurement time at each preset measurement cycle and measure battery information including at least one of voltage and temperature of the battery while operating in the measurement mode; and
a control unit configured to operate in a communication mode during a preset operation time at each preset communication cycle, receive the battery information from the measuring unit while operating in the communication mode, set a next operation time point at which the measuring unit is to operate in the measurement mode based on at least one of the communication cycle and a measurement time, and change an operation time to operate in the communication mode at each subsequent communication cycle based on the measurement time so that the operation time of the control unit to operate in the communication mode and the measurement time of the measuring unit to operate in the measurement mode overlap.

2. The battery management apparatus according to claim 1, wherein the measuring unit is configured to operate in the measurement mode at the next operation time point to measure the battery information and operate in the measurement mode at each measurement cycle after measuring the battery information.

3. The battery management apparatus according to claim 2, wherein the control unit is configured to set the next operation time point based on the measurement cycle so that the measuring unit operates in the measurement mode at an operation start point of the communication mode.

4. The battery management apparatus according to claim 1, wherein the operation time is configured to be set in advance to correspond to the measurement cycle, and
wherein the control unit is configured to change the operation time to correspond to the measurement time, after setting the next operation time point.

5. The battery management apparatus according to claim 1, wherein when the battery is provided in a plurality, the measuring unit is provided in a plurality to respectively correspond to the plurality of batteries, each measuring unit being configured to operate at each measurement cycle to measure battery information of a corresponding battery among the plurality of batteries, and wherein the control unit is configured to set the next operation time point for each of the plurality of measuring units based on at least one of the communication cycle and the measurement time.

6. The battery management apparatus according to claim 5, wherein the control unit is configured to calculate a time interval between an operation start point of the communication mode and an operation start point of the measurement mode for each of the plurality of measuring units and set the next operation time point for each of the plurality of measuring units based on the calculated time interval, the measurement cycle, and the measurement time.

7. The battery management apparatus according to claim 6, wherein the control unit is configured to set the next operation time point for each of the plurality of measuring units according to Equation 1 below based on an identification number of each of the plurality of measuring units, $$T_{NEXT} = T_S - T_{GN} + \{(N-1) \times T_P\} \quad \text{[Equation 1]}$$

where $T_{NEXT}$ is the next operation time point, $T_S$ is the measurement cycle, N is an identification number set to each of the plurality of measuring units, which is a positive number, $T_{GN}$ is a time interval between the operation start point of the communication mode of the control unit and the operation start point of the measurement mode of the measuring unit whose identification number is N, and $T_P$ is the measurement time.

8. The battery management apparatus according to claim 5, wherein the control unit is configured to set the next operation time point and then change the operation time based on the number of the plurality of measuring units and the measurement time.

9. The battery management apparatus according to claim 8, wherein the control unit is configured to change the operation time according to Equation 2 below, $$T_Q = M \times T_P \quad \text{[Equation 2]}$$

where $T_Q$ is the operation time, M is the number of the plurality of measuring units, and $T_P$ is the measurement time.

10. The battery management apparatus according to claim 1, wherein the measuring unit is configured to store the battery information measured at the each preset measurement cycle and transmit all of the stored battery information to the control unit when the control unit operates in the communication mode while the measuring unit is operating in the measurement mode.

11. The battery management apparatus according to claim 1, wherein the control unit is configured to set the next operation time point at the each preset communication cycle.

12. The battery management apparatus according to claim 1, wherein the control unit is configured to extract a voltage value and a temperature value of the battery from the received battery information, obtain a voltage comparison result by comparing the extracted voltage value with a reference voltage value, obtain a temperature comparison result by comparing the extracted temperature value with a reference temperature value, and diagnose a state of the battery based on at least one of the voltage comparison result and the temperature comparison result.

13. A battery management method, comprising:

a battery information measuring operation, by a measuring unit, of operating in a measurement mode during a predetermined measurement time at each preset measurement cycle and measuring battery information including at least one of voltage and temperature of the battery while operating in the measurement mode;

a battery information receiving operation, by a control unit, of operating in a communication mode during a preset operation time at each preset communication cycle and receiving the measured battery information while operating in the communication mode;

an operation time point setting operation, by the control unit, of setting a next operation time point at which the measuring unit is to operate in the measurement mode based on at least one of the communication cycle and a measurement time; and an operation time changing operation, by the control unit, of changing an operation time to operate in the communication mode at each subsequent communication cycle based on the measurement time so that the operation time of the control unit to operate in the communication mode and the measurement time of the measuring unit to operate in the measurement mode overlap.

14. The battery management method according to claim 13, wherein the operation time is reduced to be the same as the measurement time.

15. The battery management apparatus according to claim 4, wherein the operation time is reduced to be the same as the measurement time.

16. The battery management apparatus according to claim 8, wherein the operation time is reduced to be the same as the measurement time of the plurality of measuring units.

17. A battery management apparatus, comprising:

a measuring unit connected to a battery and configured to operate in a measurement mode during a predetermined measurement time at each preset measurement cycle and measure battery information including at least one of voltage and temperature of the battery while operating in the measurement mode; and a control unit configured to operate in a communication mode during a preset operation time at each preset communication cycle, receive the battery information from the measuring unit while operating in the communication mode, set a next operation time point at which the measuring unit is to operate in the measurement mode based on at least one of the communication cycle and a measurement time, and change an operation time to operate in the communication mode at each subsequent communication cycle based on the measurement time, wherein the operation time is configured to be set in advance to correspond to the measurement cycle, and wherein the control unit is configured to change the operation time to correspond to the measurement time, after setting the next operation time point.

18. The battery management apparatus according to claim 17, wherein the measuring unit is configured to operate in the measurement mode at the next operation time point to measure the battery information and operate in the measurement mode at each measurement cycle after measuring the battery information.

19. The battery management apparatus according to claim 17, wherein the control unit is configured to set the next operation time point at the each preset communication cycle.

20. The battery management apparatus according to claim 17, wherein the operation time is reduced to be the same as the measurement time.

* * * * *